US011300892B2

(12) United States Patent
Huisman et al.

(10) Patent No.: US 11,300,892 B2
(45) Date of Patent: Apr. 12, 2022

(54) SENSOR APPARATUS AND METHOD FOR LITHOGRAPHIC MEASUREMENTS

(71) Applicant: ASML Netherlands B.V., Veldhoven (NL)

(72) Inventors: Simon Reinald Huisman, Eindhoven (NL); Alessandro Polo, Arendonk (BE)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 17/256,408

(22) PCT Filed: Jun. 13, 2019

(86) PCT No.: PCT/EP2019/065592
§ 371 (c)(1),
(2) Date: Dec. 28, 2020

(87) PCT Pub. No.: WO2020/007588
PCT Pub. Date: Jan. 9, 2020

(65) Prior Publication Data
US 2021/0271178 A1 Sep. 2, 2021

(30) Foreign Application Priority Data
Jul. 4, 2018 (EP) .................................. 18181584

(51) Int. Cl.
*G03F 9/00* (2006.01)
*G01J 9/02* (2006.01)
(52) U.S. Cl.
CPC .......... *G03F 9/7088* (2013.01); *G01J 9/0215* (2013.01); *G03F 9/7049* (2013.01); *G03F 9/7084* (2013.01)

(58) Field of Classification Search
CPC ......... G01J 9/00; G01J 9/0215; G03F 7/7085; G03F 9/7049; G03F 9/7084; G03F 9/7088
See application file for complete search history.

(56) References Cited

U.S. PATENT DOCUMENTS

| 5,682,243 A | 10/1997 | Nishi |
| 9,778,025 B2 | 10/2017 | Mathijssen et al. |

(Continued)

FOREIGN PATENT DOCUMENTS

| JP | H08-064496 A | 3/1996 |
| JP | 2004-281904 A | 10/2004 |

(Continued)

OTHER PUBLICATIONS

International Search Report and Written Opinion of the International Searching Authority directed to related International Patent Application No. PCT/EP2019/065592, dated Oct. 11, 2019; 13 pages.

(Continued)

*Primary Examiner* — Peter B Kim
(74) *Attorney, Agent, or Firm* — Sterne, Kessler, Goldstein & Fox P.L.L.C.

(57) ABSTRACT

A sensor apparatus (300) for determining a position of a target (330) of a substrate (W) comprising, projection optics (315;321) configured to project a radiation beam (310) onto the substrate, collection optics (321) configured to collect measurement radiation (325) that has scattered from the target, a wavefront sensing system (335) configured to determine a pupil function variation of at least a portion (355) of the measurement radiation and output a signal (340) indicative thereof, and a measurement system (350) configured to receive the signal and to determine the position of the target in at least partial dependence on the collected mea- (Continued)

surement radiation and the determined pupil function variation of at least a portion of the measurement radiation.

15 Claims, 7 Drawing Sheets

(56) References Cited

U.S. PATENT DOCUMENTS

| | | |
|---|---|---|
| 2002/0015158 A1 | 2/2002 | Shiode et al. |
| 2004/0033426 A1 | 2/2004 | Den Boef et al. |
| 2009/0153825 A1 | 6/2009 | Edart et al. |
| 2017/0097575 A1 | 4/2017 | Pandey et al. |

FOREIGN PATENT DOCUMENTS

| | | | | |
|---|---|---|---|---|
| JP | 2006-157041 A | 6/2006 | | |
| JP | 2009-147317 A | 7/2009 | | |
| JP | 4404502 B2 * | 1/2010 | ........... | G03F 9/7088 |
| JP | 2015-528584 A | 9/2015 | | |
| JP | 2016 218379 A | 12/2016 | | |

OTHER PUBLICATIONS

International Preliminary Report on Patentability directed to related International Patent Application No. PCT/EP2019/065592, dated Jan. 5, 2021; 9 pages.

* cited by examiner

SENSOR APPARATUS AND METHOD FOR LITHOGRAPHIC MEASUREMENTS

CROSS-REFERENCE TO RELATED APPLICATIONS

This application claims priority of EP application 18181584.6 which was filed on 4 Jul. 2018 and which is incorporated herein in its entirety by reference.

FIELD

The present invention relates to a sensor apparatus and method for determining a position of a target of a substrate. The sensor apparatus may form part of a lithographic apparatus. The sensor apparatus may form part of a metrology tool. The sensor apparatus may be a standalone device.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually reduced whilst the amount of functional elements, such as transistors, per device has been steadily increasing over decades, following a trend commonly referred to as 'Moore's law'. To keep up with Moore's law the semiconductor industry is pursuing technologies that enable the creation of progressively smaller features. To project a pattern on a substrate a lithographic apparatus may use electromagnetic radiation. The wavelength of this radiation at least partially determines the minimum size of features that are patterned on the substrate. Typical wavelengths currently in use are 365 nm (i-line), 248 nm, 193 nm and 13.5 nm. A lithographic apparatus which uses extreme ultraviolet (EUV) radiation, having a wavelength within a range of 4 nm to 20 nm (e.g., 6.7 nm or 13.5 nm) may be used to form smaller features on a substrate than a lithographic apparatus which uses, for example, radiation having a wavelength of 193 nm.

In order to control the lithographic process to place device features accurately on the substrate, alignment marks are generally provided on the substrate, and the lithographic apparatus includes one or more alignment measurement systems by which positions of alignment marks on a substrate can be measured accurately. These alignment measurement systems are effectively position measuring apparatuses. The alignment marks aid in the accurate placement of a process layer formed on the substrate relative to previously formed process layers. Alignment measurements are typically made, within a lithographic apparatus, each time a substrate is loaded into the lithographic apparatus, before each process layer is formed. It is an object of the present invention to provide a sensor apparatus and method of determining a position of a target on the substrate which at least partially addresses one or more of the problems of the prior art, whether identified herein or elsewhere.

SUMMARY

According to a first aspect of the invention, there is provided a sensor apparatus for determining a position of a target of a substrate comprising projection optics configured to project a radiation beam onto the substrate, collection optics configured to collect measurement radiation that has scattered from the target, a wavefront sensing system configured to determine a pupil function variation of at least a first portion of the measurement radiation and output a signal indicative thereof, and a wavefront sensing system configured to determine a pupil function variation of at least first portion of the measurement radiation and output a signal indicative thereof; and a measurement system configured to receive the signal and to determine the position of the target in at least partial dependence on at least second portion of the measurement radiation and the received signal.

The pupil function variation may comprise a phase (for example a relative phase) of the first portion of the measurement radiation and/or an intensity (for example a relative intensity) of the first portion of the measurement radiation in a pupil plane of the sensor apparatus. The sensor apparatus according to the first aspect of the invention is advantageous since the position of the target is determined in at least partial dependence on the determined pupil function variation of at least a first portion of the measurement radiation.

Advantageously, this provides an arrangement whereby pupil function variation (e.g., phase and/or intensity in a pupil plane of the sensor apparatus) of the measurement radiation which may be used to at least partially correct the determined position for a range of potential errors. For example, the pupil function variation of the measurement radiation may be used to at least partially correct for any combination of one or more of the following: a deformation of the target (for example an asymmetry), errors associated with the structure of the substrate (e.g., internal reflections, apparent surface depression etc.), focus errors (e.g., telecentricity and/or tilt), optical aberrations such as astigmatism (e.g., arising from imperfect optical components of the sensor apparatus such as the projection optics and/or the collection optics) and/or unintended asymmetries present in the sensor apparatus.

Additionally, the sensor apparatus according to the first aspect of the invention enables monitoring of pupil function variation information so as to monitor how any of the above errors change over time (e.g., variations of the optical aberrations) and thereby enable their continuous or periodic correction and/or enable identification of optical components contributing to one or more errors.

The target may be an alignment mark or a metrology mark, for example, configured for overlay measurements.

The wavefront sensing system may comprise any form of wavefront sensor, e.g.

Shack-Hartmann sensor, pyramid sensor, interferometric sensor (such as a lateral shearing interferometer), etc. The wavefront sensing system may comprise one or more wavefront sensors.

The measurement system may, for example, use the determined pupil function variation of the first portion of the measurement radiation to at least partially correct a determined phase offset between diffraction orders of the collected at least second portion of the measurement radiation. The at least partially corrected phase offset may then be used to determine a position of the target of the substrate.

The wavefront sensing system may comprise a dividing optical element configured to divide the first portion of the measurement radiation into a plurality of sub-beams, a detector system configured to detect an intensity of each sub-beam and output a measurement signal indicative thereof, and a processor configured to receive the measurement signal and to determine the pupil function variation of the first portion of the measurement radiation in dependence thereon.

The dividing optical element may comprise at least one prism. The prism may be in the shape of a pyramid. The pyramid prism may be configured to divide the portion of the measurement radiation into four sub-beams.

The detector system may comprise a plurality of detectors, each of which may comprise a plurality of sensing elements, e.g., one or more CCD or CMOS detectors. The sensing elements may be arranged in an array.

The processor may comprise a plurality of processors in communication with each other and/or with a shared device.

The wavefront sensing system may further comprise a dispersive optical element configured to separate different wavelengths of the measurement radiation, at least one other dividing optical element, and a focusing element configured to focus a different part of the separated wavelengths of the measurement radiation onto each of the dividing optical elements, wherein the dividing optical elements are configured to divide the part of the separated wavelengths of measurement radiation focused thereon into a plurality of dispersed sub-beams.

This embodiment may advantageously allow detection of the pupil function variation of measurement radiation comprising a plurality of wavelengths, e.g., a plurality of discrete wavelengths and/or a continuum of wavelengths.

The dispersive optical element may comprise a grating. The dispersive optical element may comprise a prism. The dispersive optical element may be located proximate a pupil plane of the sensor apparatus.

Each dividing optical element may receive a different bandwidth of radiation.

The focusing element may comprise an array of lenses, each lens in the array being configured to focus a different part of the separated wavelengths of the measurement radiation onto one of the dividing optical elements. For example, the array of lenses may comprise a one-dimensional array of lenses, the array of lenses being arranged in a direction which corresponds to a dispersion direction of the dispersive optical element. This may allow the sensor to be used when the measurement radiation comprises a continuum of wavelengths, the lens array being used to divide the spectrum of the measurement radiation (which has been separated using the dispersive optics) into a plurality of discrete portions.

The wavefront sensing system may comprise a plurality of sampling optical elements, wherein each sampling optical element is configured to sample a different portion of a wavefront of the portion of the measurement radiation to form a plurality of sample beams, a detector system configured to detect each sample beam and output a measurement signal indicative of at least one characteristic of the sample beams, and a processor configured to receive the measurement signal and use the measurement signal to determine the pupil function variation of the portion of the measurement radiation.

The at least one characteristic of the sample beams may comprise information relating to a spatial intensity distribution of the sample beams. For example, the at least one characteristic of the sample beams may comprise a position of the sample beams (for example a position of a center of the sample beams), for example in a plane that is generally perpendicular to an optical axis of the system. Such a position of a sample beam may be dependent on the phase of the portion of the measurement radiation from which it is formed.

Additionally or alternatively, the at least one characteristic of the sample beams may comprise information relating to a total intensity of the sample beams. Such a total intensity of the sample beams may be dependent on the amplitude of the portion of the measurement radiation from which it is formed (in the pupil plane of the sensor apparatus).

The sampling optical elements may be micro-lenses. The sampling elements may be arranged in an array, e.g. a grid pattern. The sampling optical element may be located proximate a pupil plane of the sensor apparatus.

The detector system may comprise a plurality of detectors, each of which may comprise a plurality of sensing elements, e.g., one or more CCD or CMOS detectors. The sensing elements may be arranged in an array. It will be appreciated that each sample beam may, in general, be received by a plurality of different sensing elements.

The processor may comprise a plurality of processors in communication with each other and/or with a shared device.

The sensor apparatus may further comprise reimaging optics configured to reimage the portion of the measurement radiation onto the sampling elements.

The wavefront sensing system may further comprise a first dispersive optical element configured to separate different wavelengths of the sample beams, and a first focusing element configured to focus the separated wavelengths of the sample beams into dispersed sample beams.

Advantageously, this arrangement may allow pupil function variation information for a plurality of different spectral components of the at least first portion of the measurement radiation to be determined simultaneously. For example, with the use of such a first dispersive optical element, a spatial intensity distribution of the sample beam in a direction which corresponds to a dispersion direction of the first dispersive optical element is related to a spectrum of the measurement radiation. In addition, as discussed above, the spatial intensity distribution of the sample beam is dependent on the phase of the portion of the measurement radiation from which it is formed. It will be appreciated that the spectrum and aberrations of the measurement radiation are therefore entangled, so knowledge of discrete wavelengths may be used to disentangle aberration information.

This arrangement may be used when the measurement radiation comprises either a discrete set of multiple known wavelengths or a continuum of wavelengths.

The sensor apparatus may further comprise a focusing element configured to focus the sample beams onto the first dispersive optical element.

The wavefront sensing system may further comprise a beam separator configured to direct a first portion of the sample beams to a first optical branch and direct a second portion of the sample beams to a second optical branch. The first optical branch may comprise the first dispersive optical element configured to separate different wavelengths of the first portion of sample beams in a first direction, and the first focusing element configured to focus the separated wavelengths of the first portion of sample beams into first dispersed sample beams. The second optical branch may comprise a second dispersive optical element configured to separate different wavelengths of the second portion of sample beams in a different direction, and a second focusing element configured to focus the different wavelengths of the second portion of sample beams into second dispersed sample beams.

It will be appreciated that the beam separator is configured such that each of the first and second portions have substantially the same spatial intensity distributions. For example, the beam separator may be a beam splitter.

The first dispersive optical element and the second dispersive optical element have different rotational positions with respect to each other about an optical axis of the sensor apparatus. Advantageously, this allows aberration information to be disentangled from the spectrum information without any knowledge of the spectrum of the measurement radiation.

According to a second aspect of the invention, there a provided a lithographic apparatus arranged to project a pattern from a patterning device onto a substrate, the lithographic apparatus comprising a sensor apparatus according to the first aspect of the invention.

According to a third aspect of the invention, there is provided a metrology device comprising a sensor apparatus according to the first aspect of the invention.

According to a fourth aspect of the invention, there is provided a method of determining the position of a target of a substrate comprising projecting a radiation beam onto the substrate, collecting measurement radiation that has scattered from the target, determining a pupil function variation of at least a portion of the measurement radiation, and determining the position of the target in at least partial dependence on the collected measurement radiation and the determined pupil function variation.

The method may be performed using the sensor apparatus of the first aspect of the invention.

The measurement radiation may comprise different wavelengths of radiation.

The method may further comprise sampling different portions of a wavefront of the portion of the measurement radiation to form a plurality of sample beams, splitting the sample beams into a first portion of sample beams and a second portion of sample beams, separating the different wavelengths of the first portion of sample beams in a first dispersion direction to form first dispersed sample beams, separating the different wavelengths of the second portion of sample beams in a different dispersion direction to form second dispersed sample beams, comparing a displacement and/or a deformation of the first and second dispersed sample beams in the first dispersion direction, comparing a displacement and/or a deformation of the first and second dispersed sample beams in the different dispersion direction, and using the comparisons to disentangle spectrum information and pupil function variation information in the first dispersion direction and the different dispersion direction.

According to a fifth aspect of the invention, there is provided a computer program comprising computer readable instructions configured to cause a computer to carry out a method according to the fourth aspect of the invention According to a sixth aspect of the invention, there is provided a computer readable medium carrying a computer program according to the fifth aspect of the invention.

According to a seventh aspect of the invention, there is provided a computer apparatus for determining a wavefront of a radiation beam comprising a memory storing processor readable instructions, and a processor arranged to read and execute instructions stored in said memory, wherein said processor readable instructions comprise instructions arranged to control the computer to carry out a method according to the fourth aspect of the invention.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g., with a wavelength of 365, 248, 193, 157, or 126 nm) and EUV radiation (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
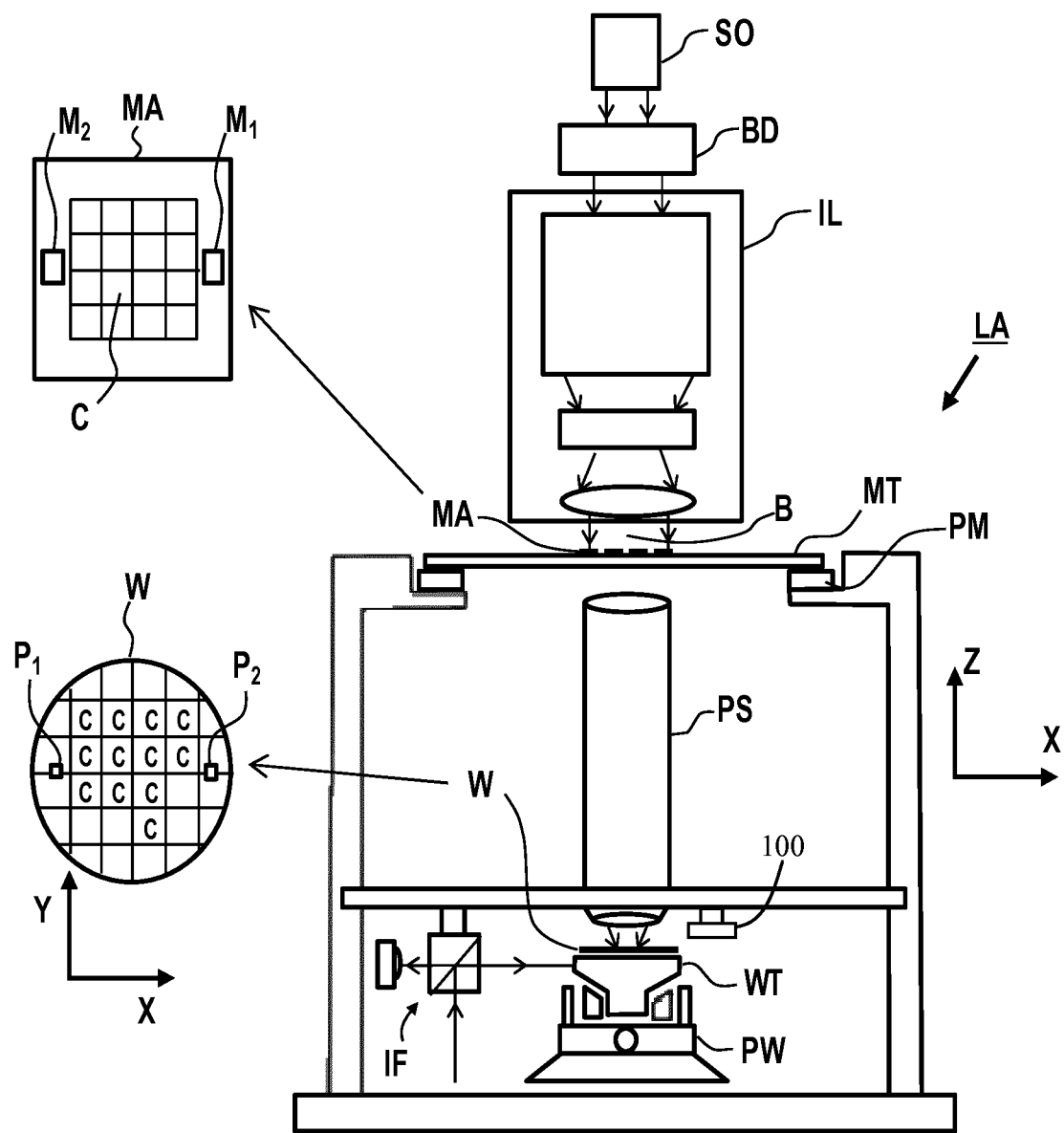
FIG. 1 depicts a schematic overview of a lithographic apparatus comprising a sensor apparatus according to an embodiment of the invention.

FIG. 1 schematically depicts a lithographic apparatus LA comprising a sensor apparatus 100 according to an embodiment of the invention. The lithographic apparatus LA includes an illumination system (also referred to as illuminator) IL configured to condition a radiation beam B (e.g., UV radiation, DUV radiation, or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support WT in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross-section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate W may be covered by a liquid having a relatively high refractive index, e.g., water, so as to fill a space between the projection system PS and the substrate W. use of liquid may be referred to as immersion lithography. More information on immersion techniques is given in U.S. Pat. No. 6,952,253, which is incorporated herein by reference.

The lithographic apparatus LA may also be of a type having two or more substrate supports WT (also named "dual stage" or "multiple stage"). In such "multiple stage" machines, the substrate supports WT may be used in parallel. Additionally or alternatively, steps involved in the preparation of a subsequent exposure of the substrate W may be carried out on the substrate W located on one of the substrate supports WT while another substrate W on the other substrate support WT is being used for the exposure of a pattern on the other substrate W. For example, one or more of the steps involved in the preparation of a subsequent exposure of the substrate W may include using the sensor apparatus 100 to determine a position of a target of the substrate W on one of the substrate supports WT while an exposure of another substrate on the other support takes place.

In addition to the substrate support WT, the lithographic apparatus LA may comprise a measurement stage. The measurement stage is arranged to hold a sensor and/or a cleaning device. The sensor may be arranged to measure a property of the projection system PS and/or a property of the radiation beam B. The measurement stage may hold multiple sensors. The measurement stage may, for example, hold the sensor apparatus 100. The cleaning device may be arranged to clean part of the lithographic apparatus LA, for example a part of the projection system PS or a part of a system that provides the immersion liquid. The measurement stage may move beneath the projection system PS when the substrate support WT is not beneath the projection system PS.

In operation, the radiation beam B is incident on the patterning device, e.g., mask, MA which is held on the mask support MT, and is patterned by the pattern (i.e. design layout) present on patterning device MA. Having interacted with the mask MA, the radiation beam B passes through the projection system PS, which focuses the radiation beam B onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. The patterning device MA and/or the substrate W may be aligned using targets such as mask alignment marks M1, M2 and substrate alignment marks P1, P2. Although the substrate alignment marks P1, P2 shown in the Example of FIG. 1 occupy dedicated target portions C, the substrate alignment marks P1, P2 may be located in spaces between the target portions C. Substrate alignment marks P1, P2 are known as scribe-lane alignment marks when they are located between the target portions C.

To clarify the invention, a Cartesian coordinate system is used. The Cartesian coordinate system has three axes, i.e., an x-axis, a y-axis and a z-axis. Each of the three axes is orthogonal to the other two axes. A rotation around the x-axis may be referred to as an Rx-rotation. A rotation around the y-axis may be referred to as an Ry-rotation. A rotation around about the z-axis may be referred to as an Rz-rotation. The x-axis and the y-axis may be described as defining a horizontal plane, whereas the z-axis may be described as being in a vertical direction relative to the horizontal plane. The Cartesian coordinate system does not limit the invention and is merely used for clarification only. Alternatively, another coordinate system, such as a cylindrical coordinate system, may be used to clarify the invention. The orientation of the Cartesian coordinate system may vary such that, for example, the z-axis has a component along the horizontal plane.

Figure 2:
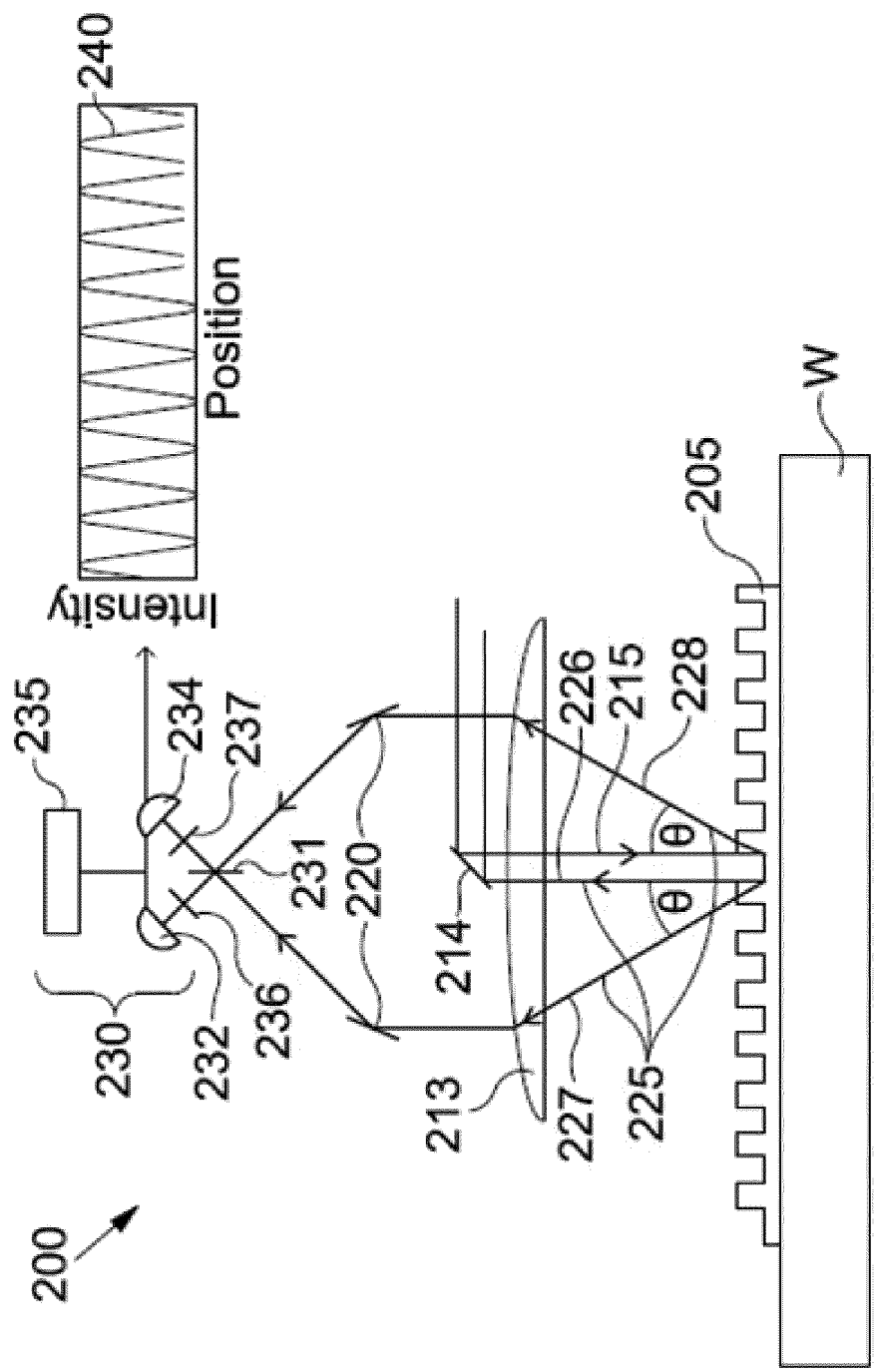
FIG. 2 schematically depicts a portion of a known sensor apparatus.

FIG. 2 schematically depicts a portion of a known sensor apparatus 200 for determining a position of a target 205 of a substrate W. The target 205 may, for example, be a substrate alignment mark (e.g., the substrate alignment marks P1, P2 shown in FIG. 1). In the example of FIG. 2, the target 205 comprises a grating located on an uppermost surface of the substrate W. The target 205 may be located elsewhere on the substrate W, e.g., buried beneath one or more layers of the substrate W. The known sensor apparatus 200 comprises projection optics configured to project a radiation beam 215 onto the substrate W. In the example of FIG. 2, the projection optics comprises a reflective element 214 that reflects the radiation beam 215 towards a lens 213 which then focuses the radiation beam 215 onto the substrate W. The projection optics may comprise other optical elements. The radiation beam 215 scatters from the target 205 to form measurement radiation 225. In the example of FIG. 2, the radiation beam 215 diffracts from the target 205 to form measurement radiation 225 comprising a plurality of diffraction orders 226-228. For clarity of understanding, only the zeroth diffraction order 226, the plus one diffraction order 227 and the minus one diffraction order 228 are shown in FIG. 2. However, it will be appreciated that the measurement radiation 225 may comprise a greater number of diffraction orders 226-228. The zeroth diffraction order 226 returns to the projection optics and is directed away from the sensor apparatus 200. The plus one and minus one diffraction orders 227, 228 scatter from the target 205 at corresponding diffraction angles θ. The diffraction angles θ may differ from one another. The sensor apparatus 200 further comprises collection optics configured to collect the measurement radiation 225 that has scattered from the target 205. In the example of FIG. 2 the collection optics comprise the lens 213 (that also forms part of the projection optics) and a pair of reflective elements 220. The plus one and minus one diffraction orders 227, 228 are collimated by the lens 213 and are reflected towards each other by the reflective elements 220 of the collection optics.

The sensor apparatus 200 further comprises a measurement system 230 configured to determine the position of the target 205 in at least partial dependence on the collected measurement radiation 225. In the example of FIG. 2 the measurement system 230 comprises a beam splitter 231, a pair of focussing elements 236, 237 and a pair of photodetectors 232, 234. The pair of photodetectors 232, 234 are in communication with a processor 235. The beam splitter 231 splits the plus one diffraction order 227 such that at least some of the plus one diffraction order 227 is incident on a first focussing element 236 and a first photodetector 232 and at least some of the plus one diffraction order 227 is incident on a second focussing element 237 and the second photodetector 234. The beam splitter 231 also splits the minus one diffraction order 228 such that at least some of the minus one diffraction order 228 is incident on the first photodetector 232 and at least some of the minus one diffraction order 238 is incident on the second photodetector 234. The beam splitter 231 therefore directs a part of each of the plus one diffraction order 227 and the minus one diffraction order 228 to each of the first and second photodetectors 232, 234. In particular, the beam splitter 231 directs a part of each of the plus one diffraction order 227 and the minus one diffraction order 228 to the first photodetector 232 with a first relative phase between them and directs a part of each of the plus one diffraction order 227 and the minus one diffraction order 228 to the second photodetector 234 with a second relative phase between them. In this way, the measurement system 230 behaves similarly to a Mach-Zehnder interferometer. The photodetectors 232, 234 are configured to measure an intensity of the resulting interference between the plus one diffraction order 227 and the minus one diffraction order 228 and generate a corresponding measurement signal.

In general, the phase of each individual diffraction beam that results from the scattering from a diffraction grating is dependent on the position of the incident radiation beam relative to the diffraction grating. If the beam spot of the incident radiation beam is scanned over the diffraction grating then the phase of the diffraction beams formed will vary.

An actuation system (not shown) is configured to generate relative movement between the substrate W and the sensor apparatus 200 whilst the radiation beam 215 is incident on the target 205. As a result an interference pattern 240 is generated, which oscillates with relative movement between the substrate W and the sensor apparatus 200. The processor 235 is configured to receive the measurement signal that is indicative of the interference pattern 240 and determine a position of the target 205 in dependence on the measurement signal. The processor 235 may, for example, be configured to determine a phase offset of the interference pattern 240 and thereby determine a positional offset between the target 205 and the sensor apparatus 200. Determining the phase offset of the interference pattern 240 may comprise performing a phase fit on the interference pattern 240. For example, the interference pattern may be decomposed in the following way:

$$c \sin(x+\sigma) = a \sin x + b \cos x$$

Where x is a position variable (which may characterize a relative position of the substrate W and the sensor apparatus 200), σ is the phase offset of the interference pattern and a and b are coefficients. A phase fit may then be performed on the interference pattern to find values for the coefficients a and b and the phase offset σ may be calculated from the determined values of the coefficients. The phase fit may comprise performing any suitable fitting method such as, for example, a least squares fit or a Fourier decomposition. The phase offset may be determined via the following equation:

$$\sigma = \tan^{-1}\left(\frac{b}{a}\right)$$

The phase offset is used to determine the position of the target 205. The determined position of the target 205 of the substrate W is dependent on the phase and the intensity distributions of the measured diffraction orders 227, 228. The phase and intensity distribution of the diffraction orders 227, 228 may be affected by a plurality of error sources. The error sources may, for example, include deformations and/or asymmetries of the target 205, variations of the thickness and/or material layers of the substrate W, focus errors (e.g., an unintended tilt of the substrate W and/or a telecentricity of an optical system) and/or optical aberrations of the optical elements 212, 220 of the sensor apparatus 200. At least some of the error sources may change over time. The error sources may cause a shift of the resulting interference pattern 240. In turn, such a shift is interpreted by the processor 235 as a shift in position of the target 205. Therefore, the shift in the interference pattern 240 caused by the error sources has a negative effect on the accuracy of measurements performed using the known sensor apparatus 200. For example, the shift of the interference pattern 240 caused by the error sources may result in a target position measurement error of between about 1 nm and about 15 nm. Target position measurement errors may negatively affect a lithographic process that is subsequently performed on the substrate W. For example, the substrate W may be misaligned with exposure radiation of a lithographic apparatus during a subsequent lithographic exposure, resulting in faulty devices being manufactured by the lithographic apparatus.

Figure 3:
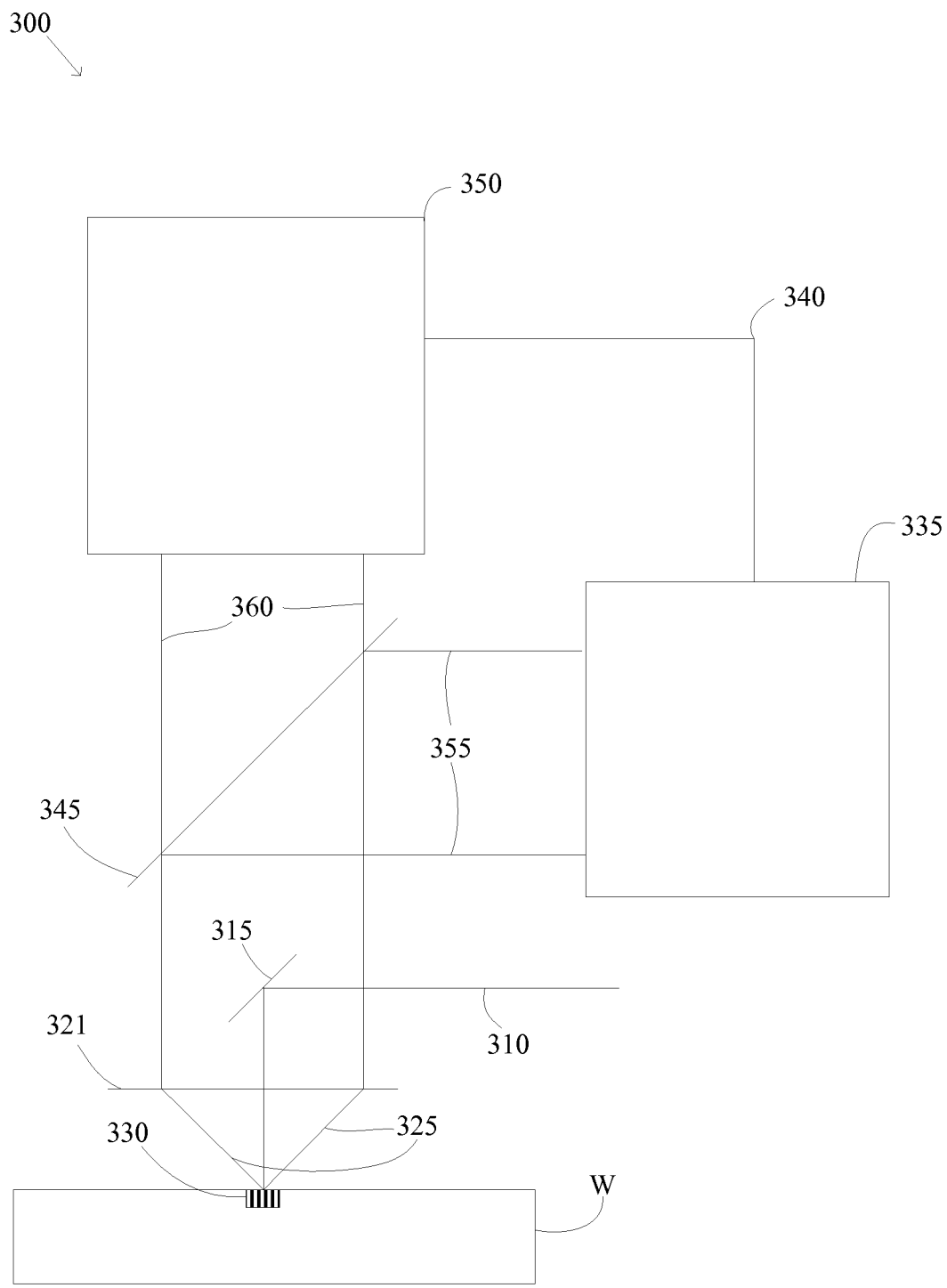
FIG. 3 schematically depicts a sensor apparatus comprising a wavefront sensing system according to an embodiment of the invention.

FIG. 3 schematically depicts a sensor apparatus 300 comprising a wavefront sensing system 335 according to an embodiment of the invention. The sensor apparatus 300 comprises projection optics configured to project a radiation beam 310 onto a substrate W. The projection optics may comprise one or more optical elements such as, for example, reflective optical elements, transmissive optical elements such as one or more lenses, etc. In the example of FIG. 3, the projection optics comprises a reflective element 315 that reflects the radiation beam towards a lens 321 which focusses the radiation beam onto the substrate W.

The sensor apparatus 300 further comprises collection optics configured to collect measurement radiation 325 that has scattered from the target 330 of the substrate W. In the example of FIG. 3, the collection optics comprises the lens 321 (which also forms part of the projection optics) which is configured to collimate the measurement radiation 325. After being collected by the collection optics, the measurement radiation 325 is incident on a beam splitter 345. The beam splitter 345 is configured to split the measurement radiation 325 such that at least a first portion of the measurement radiation 355 is incident on the wavefront sensor 335 and at least some of the second portion measurement radiation 360 is incident on a measurement system 350.

The wavefront sensing system 335 is configured to determine a pupil function variation of the at least first portion of measurement radiation 355 and output a signal 340 indicative thereof. The wavefront sensing system 335 may comprise any form of wavefront sensor, e.g. a Shack-Hartmann sensor, a pyramid sensor, an interferometric sensor (such as a lateral shearing interferometer, a Sagnac interferometer or a common path interferometer) etc. Alternatively or additionally the wavefront sensing system 335 may comprise a phase retrieval wavefront sensor.

The wavefront sensing system may comprise one or more wavefront sensors.

The measurement system 350 is configured to receive the signal 340 and determine the position of the target 330 of the substrate W in at least partial dependence on the collected measurement radiation 325 and the determined pupil function variation of the first portion of measurement radiation 355. The measurement system 350 may, for example, use the determined pupil function variation of the portion of measurement radiation 355 to at least partially correct a determined phase offset. The at least partially corrected phase offset may then be used to determine a position of the target 330 of the substrate W.

The wavefront sensing system 335 may be configured to determine information in a pupil plane of the sensor apparatus 300 (e.g., a complex pupil function variation of the first portion of measurement radiation 355). It will be appreciated by the skilled person that, in this context, the pupil plane of a sensor apparatus generally refers to the exit pupil of the collection optics. This is the image of a physical stop or aperture on the image side of the collection optics (i.e., the detector side). In practice, the pupil plane may be defined by the numerical aperture of the lens. This pupil plane may be defined as a Fourier transform plane of the plane in which the substrate is disposed (which may be referred to as an object plane). Therefore, the distribution of electric field strength of the radiation in the pupil plane is related to a Fourier transform of an object (for example a target) disposed in the object plane. In particular, the distribution of electric field strength of the radiation in the pupil plane (i.e., the angular distribution of radiation that is scattered by the target) is given by a convolution of: (a) the distribution of electric field strength of the radiation in an illumination pupil plane (i.e., the angular distribution of radiation that illuminates the target) and (b) a Fourier transform of the target. Any planes within the sensor apparatus which are conjugate to the pupil plane may also be referred to as a pupil plane. The object plane (i.e. the plane in which the substrate and target are disposed) and any planes within the sensor apparatus which are conjugate thereto may be referred to as field planes. It will be appreciated that within an optical system (e.g., a sensor apparatus) two planes are conjugate if each point within the first plane is imaged onto a point in the second plane. The wavefront sensing system 335 may be configured to determine an intensity distribution of the portion of measurement radiation 355 as a function of a coordinate of a numerical aperture of the sensor apparatus 300. The wavefront sensing system 335 may be configured to determine a wavefront (i.e., the relative phase of the electromagnetic field) of the portion of measurement radiation 355 as a function of a coordinate of the numerical aperture of the sensor apparatus 300. Additionally or alternatively, the wavefront sensing system 335 may be configured to determine a relative intensity of the portion of measurement radiation 355 in a pupil plane of the sensor apparatus as a function of a coordinate of the numerical aperture of the sensor apparatus 300.

The measurement radiation 325 may consist of a single spectral component. That is, the measurement radiation 325 may consist of a single wavelength of radiation or a small bandwidth of radiation (which may be referred to as monochromatic radiation). Alternatively, the measurement radiation 325 may comprise a plurality of different wavelengths of radiation. That is, the measurement radiation 325 may comprise a plurality of spectral components. The spectral components may be discrete bandwidths of radiation. Alternatively, the spectral components may form a continuum of wavelengths of radiation. The wavefront sensing system 335 may comprise a dispersive optical element (not shown) that enables that wavefront sensing system to simultaneously measure the pupil function variation of different spectral components of the measurement radiation 325.

Figure 4:
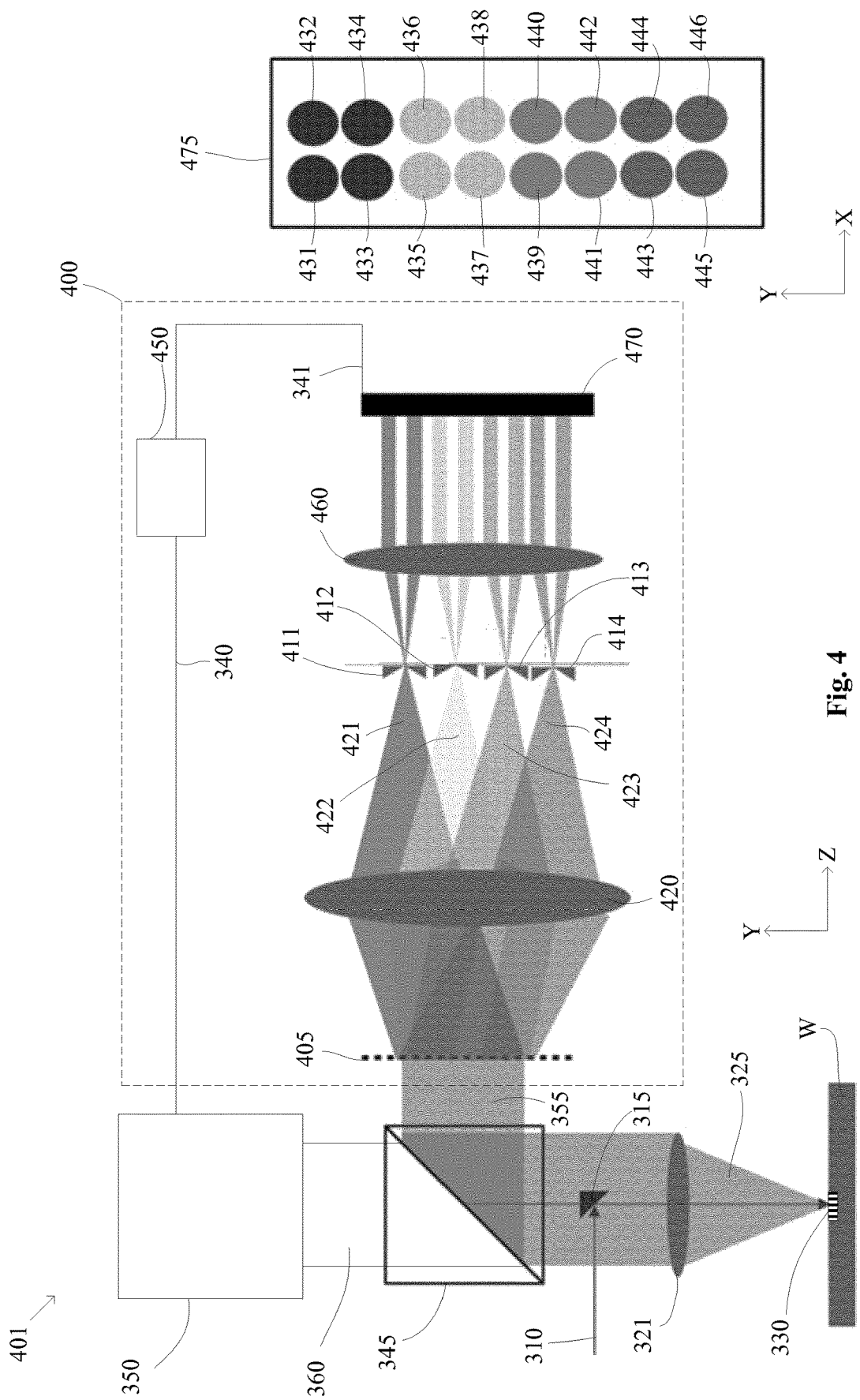
FIG. 4 schematically depicts a sensor apparatus comprising a wavefront sensing system having a dispersive optical element and a plurality of dividing optical elements according to an embodiment of the invention.

FIG. 4 schematically depicts a sensor apparatus 401 comprising a wavefront sensing system 400 having a dispersive optical element 405 and a plurality of dividing optical elements 411-414 according to an embodiment of the invention. The sensor apparatus 401 of FIG. 4 shares many common components with the sensor apparatus 300 of FIG. 3, and like parts are given like reference numerals. The wavefront sensing system 400 of FIG. 4 may be an embodiment of the wavefront sensing system 335 shown in FIG. 3. Differences between FIG. 3 and FIG. 4 are discussed below.

The dispersive optical element 405 is configured to separate different wavelengths of the first portion of measurement radiation 355. That is, the dispersive optical element 405 makes a plurality of wavelength component copies of the portion of the measurement radiation 355 in the pupil plane. In the example of FIG. 4, the dispersive optical element 405 comprises a grating. Alternatively, the dispersive optical element 405 may comprise a dispersive prism. The dispersive optical element 405 is located proximate a pupil plane of the sensor apparatus and disperses the first portion of measurement radiation 355 in dependence on the constituent wavelengths of the measurement radiation 325. In the example of FIG. 4, the measurement radiation 325 comprises four discrete spectral components 421-424. The four discrete spectral components 421-424 may, for example, comprise bandwidths of radiation of between about 500 nm and about 900 nm. For example, a first discrete spectral component 421 may have a central wavelength of about 500 nm (for example 532 nm). A second discrete spectral component 422 may have a central wavelength of about 600 nm (for example 635 nm). A third discrete spectral component 423 may have a central wavelength of about 800 nm (for example 780 nm). A fourth discrete spectral component 424 may have a central wavelength of about 900 nm (for example 850 nm). Each discrete spectral component may have a bandwidth of wavelength of between about 1 nm and about 20 nm.

The separated discrete spectral components 421-424 of the portion of measurement radiation 355 are incident on a focussing element 420. The focusing element 420 is configured to focus a different one of the spectral components 421-424 onto each of the dividing optical elements 411-414. That is, each of the wavelength component copies of the portion of the measurement radiation 355 in the pupil plane is imaged onto a different one of the dividing optical elements 411-414. The dividing optical elements 411-414 are located proximate a field plane of the sensor apparatus 401. The dividing optical elements 411-414 may be arranged in an array. Each dividing optical element 411-414 may receive a different spectral component of the portion of measurement radiation 355. The dividing optical elements 411-414 may be configured to divide the part of the separated wavelengths 421-424 of measurement radiation focused thereon into a plurality of dispersed sub-beams 431-446. That is, each dividing optical element 411-414 makes a plurality of sub-beams 431-446 (e.g., dividing optical element 411 makes sub-beams 431-434, dividing optical element 412 makes sub-beams 435-438, dividing optical element 413 makes sub-beams 439-442, and dividing optical element 414 makes sub-beams 443-446). FIG. 4 also shows a detector view 475 (which is in a plane that is perpendicular to the optical axis of the detector system 470).

The detector view 475 shows the dispersed sub-beams 431-446 as detected by the detector system 470. The dividing optical elements 411-414 thereby form a plurality of wavelength-dependent images of the pupil field of the sensor apparatus at a detector system 470. The plurality of dispersed sub-beams 431-446 pass through a collimating optical element 460 before being incident on the detector system 470. The collimating optical element 460 images the pupil field such that a plurality of displaced images for each discrete spectral component 421-424 are formed at the detector system 470.

The detector system 470 is configured to detect an intensity of each sub-beam 431-446 and output a measurement signal 341 indicative thereof. The detector system 470 may comprise a plurality of sensing elements (not shown). The sensing elements may, for example, be pixels of a CCD detector or a CMOS detector. The wavefront sensing system 335 further comprises a processor 450 configured to receive the measurement signal 341 and determine the pupil function variation of the portion 355 of the measurement radiation 325 in dependence thereon. The measurement system 350 receives a signal 340 output by the processor 450 and uses the signal 340 to determine the position of the target in at least partial dependence on the collected measurement radiation and the determined pupil function variation of at least a portion of the measurement radiation The phase (i.e., wavefront) of the measurement radiation 325 at the pupil plane of the sensor apparatus at least partially determines the relative intensities of each set of sub-beams 431-434, 435-438, 439-442, 443-446. The detector system 470 is configured to measure the intensities of the dispersed sub-beams 431-446 and output a measurement signal 341 indicative thereof. The processor 450 is configured to receive the measurement signal 341 and use the measurement signal 341 to determine a pupil function variation of the measurement radiation 325 for each of its spectral components 421-424. For example, the wavefront of one of the spectral components 421-424 of the portion of measurement radiation 355 in the X and Y directions may be determined using the following equations:

$$\frac{\partial W}{\partial x} = \frac{(I_1 + I_2) - (I_3 + I_4)}{(I_1 + I_2 + I_3 + I_4)} \quad \text{Equation 1}$$

$$\frac{\partial W}{\partial y} = \frac{(I_1 + I_3) - (I_2 + I_4)}{(I_1 + I_2 + I_3 + I_4)} \quad \text{Equation 2}$$

Where $$\frac{\partial W}{\partial x}$$

is the gradient or the wavefront in the X direction, $$\frac{\partial W}{\partial y}$$

is the gradient of the wavefront in the Y direction, $I_1$, $I_2$, $I_3$, and $I_4$ are the intensity distributions in the XY plane of the top-left, top-right, bottom-left and bottom-right sub-beams of one of the spectral components of the first portion of measurement radiation 355. For example, in the case of spectral component 421, $I_1$ may be the intensity distribution of sub-beam 431, $I_2$ may be the intensity distribution of sub-beam 432, $I_3$ may be the intensity of sub-beam 433 and $I_4$ may be the intensity of sub-beam 434. Corresponding equations may be performed for the sub-beams 435-446 associated with the other spectral components 422-424 of the portion of measurement radiation 355 in order to determine the pupil function variation of the measurement radiation for every spectral component of the measurement radiation. An amplitude of the portion of measurement radiation 355 may be determined by calculating the sum of the intensity distributions of the sub-beams 431-446. The embodiment of the invention shown in FIG. 4 may advantageously allow detection of the pupil function variation of the portion of measurement radiation 355 comprising a plurality of discrete spectral components 421-424 (i.e. a plurality of discrete bandwidths of wavelengths of radiation). The discrete spectral components 421-424 may be known. For example, the four discrete spectral components 421-424 may comprise bandwidths of radiation of between about 500 nm and about 900 nm. For example, a first discrete spectral component 421 may have a central wavelength of about 500 nm (for example 532 nm). A second discrete spectral component 422 may have a central wavelength of about 600 nm (for example 635 nm). A third discrete spectral component 423 may have a central wavelength of about 800 nm (for example 780 nm). A fourth discrete spectral component 424 may have a central wavelength of about 900 nm (for example 950 nm). Each discrete spectral component may have a bandwidth of wavelength of between about 10 nm and about 20 nm.

Figure 5:
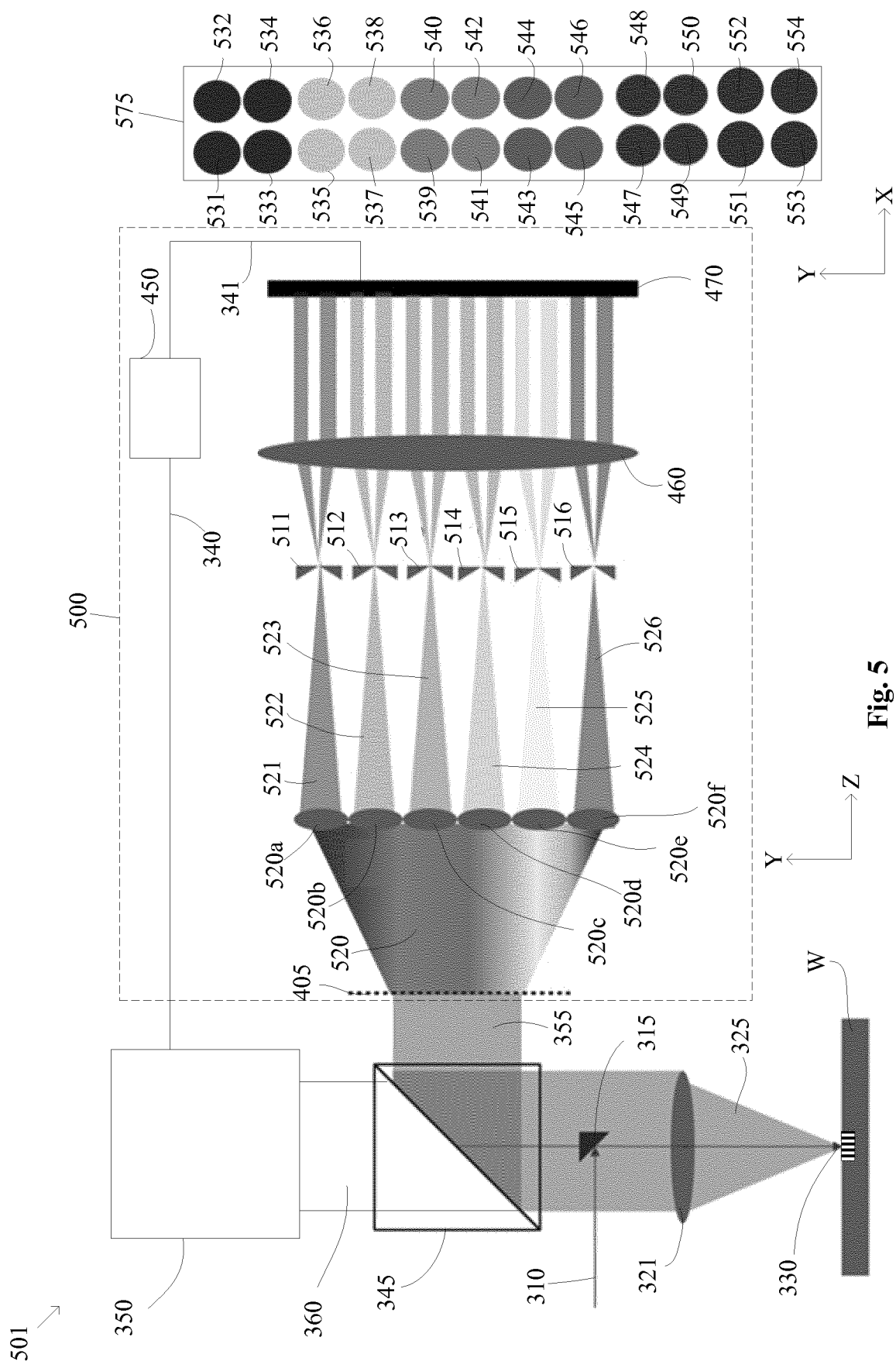
FIG. 5 schematically depicts a sensor apparatus comprising a wavefront sensing system having a focusing element comprising an array of lenses according to an embodiment of the invention.

FIG. 5 schematically depicts a sensor apparatus 501 comprising a wavefront sensing system 500 having a focusing element comprising an array of lenses 520a-520f according to an embodiment of the invention. The sensor apparatus 501 of FIG. 5 shares many common components with the sensor apparatus 300 of FIG. 3, and like parts are given like reference numerals. The wavefront sensing system 500 of FIG. 5 may be an embodiment of the wavefront sensor 335 shown in FIG. 3. Differences between FIG. 3 and FIG. 5 are discussed below.

The wavefront sensing system 500 depicted in FIG. 5 is the same as the wavefront sensing system of FIG. 4 except that the measurement radiation 325 comprises a continuum of wavelengths of radiation 520 and the single focussing element 420 has been replaced by an array of lenses 520a-520f. The dispersive optical element 405 is located proximate a pupil plane of the sensor apparatus and disperses the portion of measurement radiation 355 in dependence on the wavelength of the measurement radiation 325. In the example of FIG. 5, the measurement radiation 325 comprises a continuum of wavelengths of radiation. The dispersive optical element 405 disperses this continuum of wavelengths of radiation.

The continuum of radiation from the portion of measurement radiation 355 is incident on the array of lenses 520a-520f. The array of lenses 520a-520f act to separate the continuum of wavelengths of radiation into discrete spectral components 521-526. Each spectral component 521-526 comprises a sub-bandwidth of the continuum of wavelengths of radiation 520. The array of lenses 520a-520f is arranged to focus a different part of the separated spectral components 521-526 onto each of the dividing optical elements 511-516. That is, each lens 520a-520f receives a discrete sub-bandwidth of the portion of measurement radiation 355 and forms an image thereof at a field plane of the sensor apparatus. Each lens in the array of lenses 520a-520f may be configured to focus a different part of the separated spectral components 521-525 of the portion of measurement radiation 355 onto one of the plurality of dividing optical elements 511-516. That is, each of the wavelength component copies of the portion of the measurement radiation 355 in the pupil plane is imaged onto a different one of the dividing optical elements 511-516. For example, the array of lenses 520a-520f may comprise a one-dimensional array of lenses, the array of lenses being arranged in a direction Y which corresponds to a dispersion direction Y of the dispersive optical element 405. The dispersion direction of the dispersive optical element 405 is the direction in which the dispersive optical element separates the spectral components 521-526 of the portion of measurement radiation 355. In the example of FIG. 5, the lens array 520a-520f comprises six lenses. The lens array 520a-520f may comprise a greater or smaller number of lenses. The number of lenses in the lens array 520a-520f may at least partially depend upon an exit pupil diameter and/or a dispersion power of the dispersive optical element 405. The lens array 520a-520f may, for example, comprise between about 10 lenses and about 30 lenses, e.g. about 20 lenses. Each lens in the lens array 520a-520f may have a diameter of between about 250 microns and about 750 microns, e.g., about 500 microns.

The dividing optical elements 511-516 are located proximate a field plane of the sensor apparatus. Each dividing optical element 511-516 may receive a different sub-bandwidth of radiation 521-526. The dividing optical elements 511-516 may be configured to divide the part of the separated spectral components 521-526 of measurement radiation focused thereon into a plurality of dispersed sub-beams 531-554. That is, each dividing optical element 511-516 makes a plurality of sub-beams 531-554 (e.g., dividing optical element 511 makes sub-beams 531-534, dividing optical element 512 makes sub-beams 535-438, dividing optical element 513 makes sub-beams 539-542, and dividing optical element 514 makes sub-beams 543-546, dividing optical element 515 makes sub-beams 547-550 and dividing optical element 516 makes sub-beams 551-554). FIG. 5 includes a detector view 575, which is in a plane that is perpendicular to the optical axis of the detector system 470. The detector view 575 shows the dispersed sub-beams 531-554 as detected by the detector system 470. The dividing optical elements 511-516 may be configured to form a plurality of wavelength-dependent images of the pupil field of the sensor apparatus at a detector system 470. The plurality of dispersed sub-beams 531-554 pass through a collimating optical element 460 before being incident on the detector system 470. The collimating optical element 460 images the pupil field such that a plurality of displaced images of the dispersed sub-beams 531-554 for each discrete spectral component 521-526 are formed at the detector system 470.

The detector system 470 is configured to detect an intensity of each dispersed sub-beam 531-554 and output a measurement signal 341 indicative thereof. The detector system 470 may comprise a plurality of sensing elements (not shown). The sensing elements may, for example, be pixels of a CCD detector. The wavefront sensing system 500 further comprises a processor 450 configured to receive the measurement signal 341 and determine the pupil function variation of the first portion of the measurement radiation 355 in dependence thereon. The processor 450 may determine the pupil function variation of the portion of the measurement radiation 355 in the same manner as discussed above in relation to FIG. 3. That is, Equation 1 and Equation 2 may be performed for each of the spectral components 521-526 and their associated dispersed sub-beams 531-554.

In some embodiments, the wavefront sensing system may comprise a single dividing optical element. The dividing optical element may be configured to divide the portion 355 of the measurement radiation 325 into a plurality of sub-beams so as to determine wavefront gradient information in one or more directions. The dividing optical element may, for example, comprise an axicon prism so as to determine continuous wavefront gradient information. The dividing optical element may be a prism such as, for example, a pyramid sensor. The pyramid sensor may split the portion of the measurement radiation into four sub-beams. The dividing optical element may be placed in a field plane of the sensor apparatus. The wavefront sensing system may further comprise a detector system configured to detect an intensity of each sub-beam and output a measurement signal indicative thereof. The detector system may comprise a plurality of detectors, each of which may comprise a plurality of sensing elements, e.g., one or more CCD or CMOS detectors. For example, the detector system may comprise an array of 100×100 photosensitive pixels. A greater number of pixels or a denser pixel array may be used to improve a spatial resolution of the sensor apparatus. The sensing elements may be arranged in an array. The wavefront sensing system may further comprise a processor configured to receive the measurement signal and determine the pupil function variation of the portion of the measurement radiation in dependence thereon. The processor may comprise a plurality of processors in communication with each other and/or with a shared device. An intensity of each sub-beam on the detector system may be at least partially dependent on a wavefront of the portion of the measurement radiation that is incident on the dividing optical element. That is, the wavefront of the portion of the measurement radiation in the pupil plane of the sensor apparatus affects the light flux into each of the sub-beams from the radiation incident on the dividing optical element in the wavefront sensing system. Thus, the intensity of the sub-beams may be measured and used to determine a pupil function variation of the portion of the measurement radiation. The pupil function variation may be a relative phase and/or a relative intensity of the portion of measurement radiation in a pupil plane of the sensor apparatus. A summed intensity of the sub-beams may be measured and used to determine an intensity of the portion of measurement radiation in the pupil plane of the sensor apparatus. Determining both phase information and intensity information from the pupil plane of the sensor apparatus advantageously provides information regarding the full complex field pupil.

Figure 6:
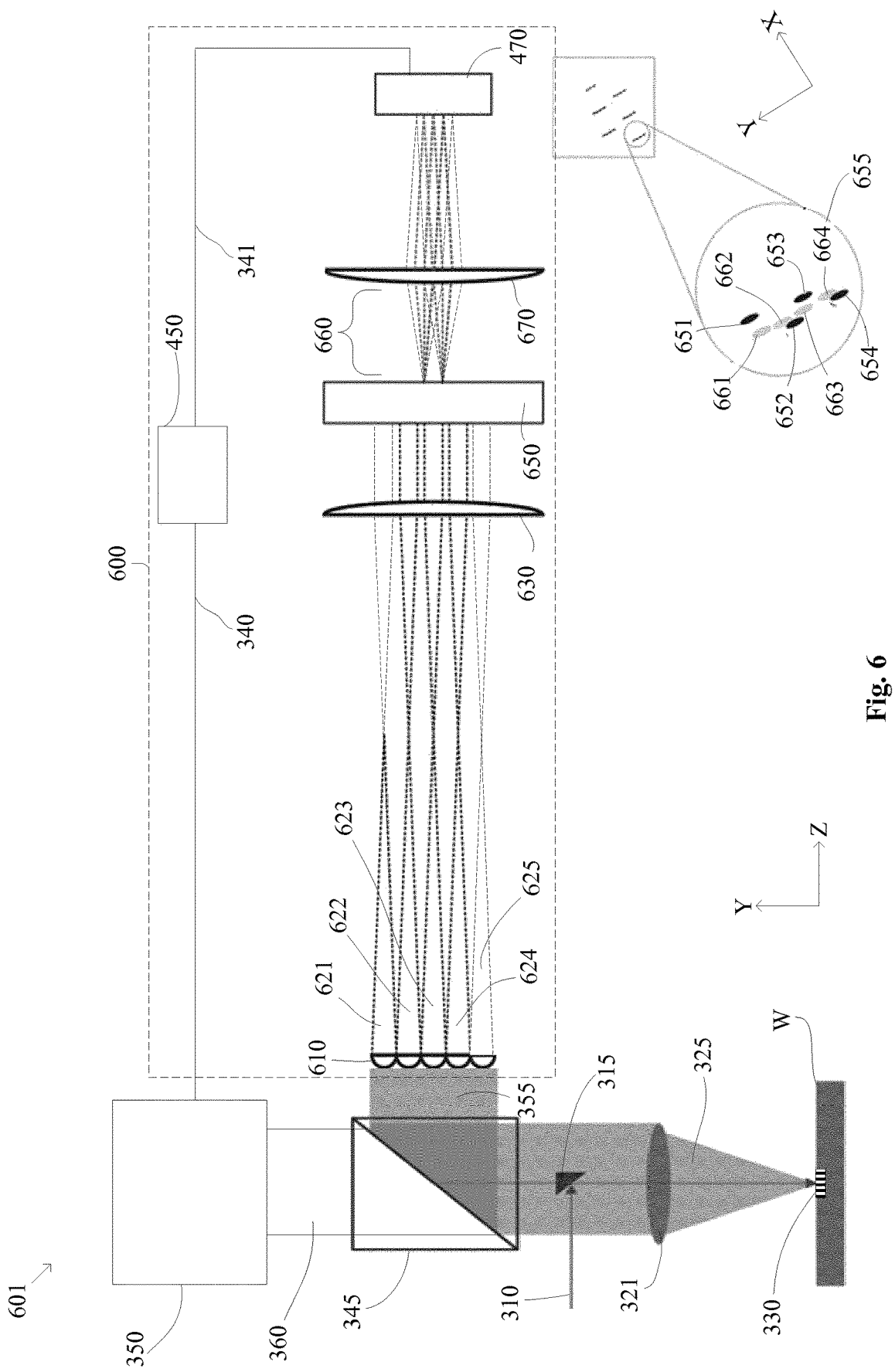
FIG. 6 schematically depicts a sensor apparatus comprising a wavefront sensing system having a plurality of sampling optical elements and a first dispersive optical element according to an embodiment of the invention; and, FIG. 7 schematically depicts a sensor apparatus comprising a wavefront sensing system having two optical branches according to an embodiment of the invention.

FIG. 6 schematically depicts a sensor apparatus 601 comprising a wavefront sensing system 600 having a plurality of sampling optical elements 610 and a first dispersive optical element 650 according to an embodiment of the invention. The sensor apparatus 601 of FIG. 6 shares many common components with the sensor apparatus 300 of FIG. 3, and like parts are given like reference numerals. The wavefront sensing system 600 of FIG. 6 may be an embodiment of the wavefront sensing system 335 shown in FIG. 3. Differences between FIG. 3 and FIG. 6 are discussed below.

After scattering from the target 330 of the substrate W and reflecting from the beam splitter 345, the first portion of measurement radiation 355 is incident on the plurality of sampling optical elements 610. The wavefront sensing system 600 may further comprise imaging optics (not shown), such as a lens, configured to image the portion of the measurement radiation 355 onto the sampling elements 610. Each sampling optical element 610 may be configured to sample a different portion of a wavefront of the portion of the measurement radiation 355 to form a plurality of sample beams 621-625. The sampling optical elements 610 may comprise micro-lenses. A diameter of the micro-lenses may at least partially depend upon a desired resolution of the sensor apparatus. Each micro-lens may, for example, have a diameter that is greater than about 1 µm. Each micro-lens may, for example, have a diameter that is less than about 500 µm. The sampling elements 610 may be arranged in an array, e.g. a grid pattern. The number of sampling elements in the array may at least partially depend upon a desired resolution of the sensor apparatus. The array may, for example, comprise about 100 sampling elements or more. The array may, for example, comprise about 10000 sampling elements or less. A given diffraction order of the measurement radiation 355 may be sampled by a plurality of sampling optical elements 610.

The wavefront sensing system 600 may further comprise a collimating optical element 630 configured to collimate the sample beams 621-625 before the sample beams are incident on the first dispersive optical element 650. The first dispersive optical element 650 is located proximate a pupil plane of the sensor apparatus. The first dispersive optical element 650 may be configured to separate different spectral components 651-654 of the sample beams 621-625. That is, the first dispersive optical element 650 may be configured to disperse in a dispersion direction (the Y-direction in FIG. 6) the intensity distributions of the sample beams 621-625 as a function of the wavelength of the measurement radiation 325. In the example of FIG. 6, the measurement radiation 325 comprises four discrete spectral components 651-654. The four discrete spectral components 651-654 may, for example, comprise bandwidths of radiation of between about 500 nm and about 900 nm. For example, a first discrete spectral component 421 may have a central wavelength of about 500 nm (for example 532 nm). A second discrete spectral component 422 may have a central wavelength of about 600 nm (for example 635 nm). A third discrete spectral component 423 may have a central wavelength of about 800 nm (for example 780 nm). A fourth discrete spectral component 424 may have a central wavelength of about 900 nm (for example 850 nm). Each discrete spectral component may have a bandwidth of wavelength of between about 1 nm and about 20 nm. The separated spectral components of the sample beams 621-625 may be referred to as dispersed sample beams 660.

The separated spectral components 660 of the sample beams 621-625 are incident on a focussing element 670. The focussing element 670 focuses the dispersed sample beams 660 onto a detector system 470. The detector system 470 may be configured to detect each dispersed sample beam 660 and output a measurement signal 341 indicative of at least one characteristic of the dispersed sample beams. The at least one characteristic of the dispersed sample beams 660 may comprise information relating to a spatial intensity distribution of the dispersed sample beams. For example, the at least one characteristic of the dispersed sample beams 660 may comprise a position of the dispersed sample beams (for example a position of a centre of the dispersed sample beams), e.g., in a plane that is generally perpendicular to an optical axis of the sensor apparatus. The position of a dispersed sample beam 651-654 may be dependent on the phase of the first portion of the measurement radiation 355 from which the dispersed sample beam 651-654 is formed. The detector system 470 may comprise a plurality of detectors (not shown), each of which may comprise a plurality of sensing elements, e.g., one or more CCD detectors. The sensing elements may be arranged in an array, e.g., a grid pattern. It will be appreciated that each dispersed sample beam 651-654 may, in general, be received by a plurality of different sensing elements of the detector system 470.

The wavefront sensing system 600 may further comprise a processor 450 configured to receive the measurement signal 341 and use the measurement signal 341 to determine the phase of the portion of the measurement radiation 355. The processor 450 may comprise a plurality of processors in communication with each other and/or with a shared device.

A magnified view 655 of four dispersed sample beams 651-654 associated with one of the sample beams 625 as detected by the detector system 470 is shown in FIG. 6. Each dispersed sample beam 651-654 may have an expected position 661-664 on the detector system 470. The expected positions 661-664 of the dispersed sample beams 651-654 may, for example, be the positions of the dispersed sample beams 651-654 when the measurement radiation 325 has a substantially flat wavefront. An offset between the position of a dispersed sample beam 651-654 and an expected position of the dispersed sample beam 661-664 may be used to determine a phase of the measurement radiation 325. For example, the offset between the position of a dispersed sample beam 651-654 and an expected position of the dispersed sample beam 661-664 may be used to determine a variation of the wavefront of the measurement radiation 325 from a substantially flat wavefront.

Advantageously, the embodiment depicted in FIG. 6 may allow phase information for a plurality of different spectral components 651-654 of the measurement radiation 325 to be determined simultaneously. For example, with the use of the first dispersive optical element 650, a spatial intensity distribution of the sample beams 621-625 in the Y-direction which corresponds to a dispersion direction of the first dispersive optical element 650 is related to a spectrum of the measurement radiation 325. In addition, as discussed above, the spatial intensity distributions of the sample beams 621-625 are dependent on the phase of the portion of the measurement radiation 355 from which the sample beams 621-625 are formed. The spectrum information and phase information of the measurement radiation 355 are therefore entangled. Knowledge of the discrete spectral components 651-654 may be used to disentangle spectral information from the measurement signal 341, thus revealing a phase of the measurement radiation 325.

As explained above, the processor 450 of the wavefront sensing system 600 is configured to receive the measurement signal 341 and use the measurement signal 341 to determine the phase of one or more portions of the measurement radiation 355. Also as explained above, this phase information is determined from the spatial intensity distributions of the sample beams 621-625, which are dependent on the phase of the portion of the measurement radiation 355 from which the sample beams 621-625 are formed. Additionally or alternatively, the processor 450 of the wavefront sensing system 600 may be configured to receive the measurement signal 341 and use the measurement signal 341 to determine the amplitude of one or more portions of the measurement radiation 355. This amplitude information may be determined from total or overall intensities of the sample beams 621-625, which are dependent on the amplitude of the portion of the measurement radiation 355 from which the sample beams 621-625 are formed. In general the processor 450 of the wavefront sensing system 600 is configured to receive the measurement signal 341 and use the measurement signal 341 to determine pupil function variations (for example phase and/or amplitude) of one or more portions of the measurement radiation 355.

Alternatively a wavefront sensing system comprising two optical branches may be used to disentangle spectral information and phase information of the measurement radiation, as now discussed.

Figure 7:
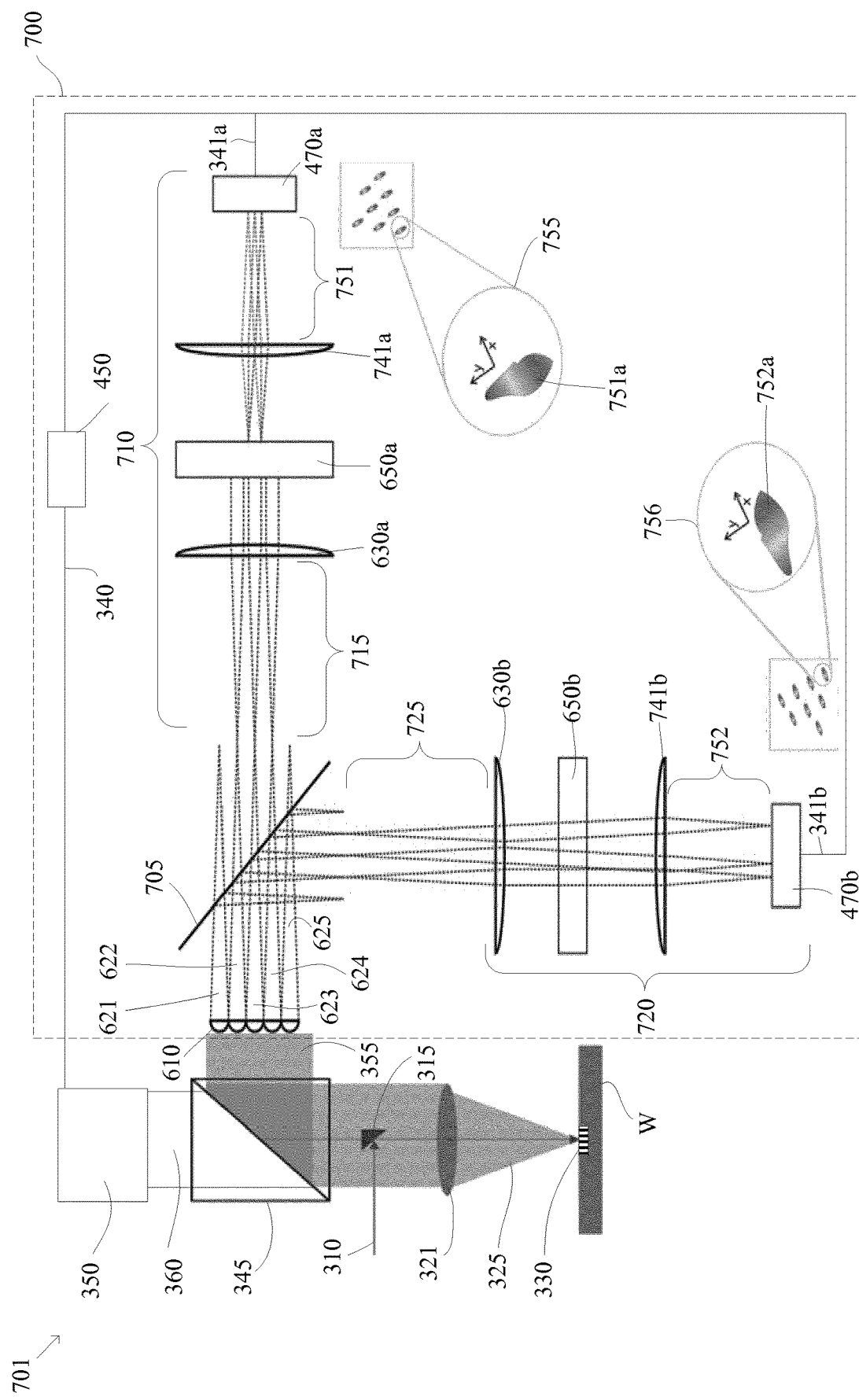

FIG. 7 schematically depicts a sensor apparatus 701 comprising a wavefront sensing system 700 having two optical branches 710, 720 according to an embodiment of the invention. The sensor apparatus 701 of FIG. 7 shares common components with the sensor apparatus 300 of FIG. 3, and like parts are given like reference numerals. The wavefront sensor 700 of FIG. 7 may be an embodiment of the wavefront sensing system 335 shown in FIG. 3. Differences between FIG. 3 and FIG. 7 are discussed below. The sensor apparatus of FIG. 7 is the same as the sensor apparatus of FIG. 6 except that the measurement radiation 325 comprises a continuum of wavelengths of radiation and the wavefront sensing system of FIG. 7 comprises a beam splitter 705 and an additional optical branch 720.

After scattering from the target 330 of the substrate W and reflecting from the beam splitter 345, the portion of measurement radiation 355 is incident on a plurality of sampling optical elements 610. The wavefront sensing system 700 may further comprise imaging optics (not shown), such as a lens, configured to image the portion of the measurement radiation 355 onto the sampling elements 610. Each sampling optical element 610 may be configured to sample a different portion of a wavefront of the portion of the measurement radiation 355 to form a plurality of sample beams 621-625. The wavefront sensing system 700 may comprise a beam separator 705 configured to direct a first portion of the sample beams 715 to the first optical branch 710 and direct a second portion of the sample beams 725 to a second optical branch 720. The beam separator 705 is configured such that each of the first and second portions 715, 725 have substantially the same spatial intensity distributions. For example, the beam separator 705 may be a beam splitter.

The first optical branch 710 may comprise a collimating optical element 630a configured to collimate the first portion 715 of sample beams 621-625 before the sample beams are incident on a first dispersive optical element 650a. The first dispersive optical element 650a is located proximate a pupil plane of the sensor apparatus. The first dispersive optical element 650a may be configured to separate different wavelengths of the first portion of sample beams 715 in a first direction (Y-direction in FIG. 7). That is, the first dispersive optical element 650 may be configured to disperse the intensity distributions of the sample beams 621-625 as a function of the wavelength of the measurement radiation 325 in the Y direction. The first optical branch 710 may further comprise a first focusing element 741a configured to focus the separated wavelengths of the first portion of sample beams 715 into first dispersed sample beams 751.

The first dispersed sample beams 751 are incident on a detector system 470a. The detector system 470a may be configured to detect each first dispersed sample beam 751 and output a measurement signal 341a indicative of at least one characteristic of the first dispersed sample beams 751, e.g., information relating to a spatial intensity distribution of the first dispersed sample beams 751. For example, the at least one characteristic of the first dispersed sample beams 751 may comprise a position of the first dispersed sample beams 751 (for example a position of a centre of the first dispersed sample beams), e.g., in a plane that is generally perpendicular to an optical axis of the sensor apparatus. The positions of the first dispersed sample beams 751 may be dependent on the phase of the portion of the measurement radiation 355 from which the first dispersed sample beams 751 are formed. The detector system 470a may comprise a plurality of detectors (not shown), each of which may comprise a plurality of sensing elements, e.g., one or more CCD or CMOS detectors. The sensing elements may be arranged in an array, e.g., a grid pattern. It will be appreciated that each of the first dispersed sample beams 751 may, in general, be received by a plurality of different sensing elements of the detector system 470a.

The second optical branch 720 may comprise the same components as the first optical branch 710 namely: a second collimating optical element 630b, a second dispersive element 650b, a second focussing optical element 741b and a second detector system 470b. However, the second dispersive optical element 650b is configured to separate the constituent wavelengths of the second portion of sample beams 725 in a different direction (X-direction in FIG. 7) compared to the first dispersive optical element 650a. The second focusing element 741b is configured to focus the different wavelengths of the second portion of sample beams 725 into second dispersed sample beams 752. The first dispersive optical element 650a and the second dispersive optical element 650b may have different rotational positions with respect to each other about an optical axis of the sensor apparatus.

A magnified view 755 of a first dispersed sample beam 751a as detected by the detector system 470 is shown in FIG. 7. The first dispersed sample beam 751a has been dispersed by the first dispersive optical element 650a in a first dispersion direction (the Y-direction). The dispersion direction of the first dispersive optical element 650a is the direction in which the dispersive optical element 650a separates the spectral components of the first portion of sample beams 715. In addition, optical aberrations will cause displacement and/or deformation of the sample beams 751 in both the X-direction and the Y-direction. Displacement and/or deformation of the first sample beam 751a in the X direction is determined at least in part by the wavefront (i.e. phase) of the part of measurement radiation 355 from which it is formed in the X-direction. A magnified view 756 of a second dispersed sample beam 752a as detected by the detector system 470b is shown in FIG. 7. The second dispersed sample beam 752a has been dispersed by the second dispersive optical element 650b in a second dispersion direction (the X-direction). The dispersion direction of the second dispersive optical element 650b is the direction in which the second dispersive optical element 650b separates the spectral components of the second portion of sample beams 715. In addition, optical aberrations will cause displacement and/or deformation of the sample beams 752 in both the X-direction and the Y-direction. Displacement and/or deformation of the second sample beam 752a in the Y direction is determined at least in part by the wavefront (i.e. phase) of the measurement radiation 325 in the Y-direction and the X-direction.

Thus, a displacement and/or deformation of the first and second dispersed sample beams 751, 752 on the detector system 470a, 470b may be determined at least in part by both a spectrum of the portion of measurement radiation 355 and a phase of the portion of the measurement radiation 355. In the X-direction, displacement and/or deformation of the first dispersed sample beams 751 is dependent on the phase of the portion of measurement radiation 355 whereas displacement and/or deformation of the second dispersed sample beams 752 is dependent on both the phase and the spectral components of the portion of measurement radiation 355. By comparing the displacement and/or deformation of the dispersed sample beams 751, 752 in a first dispersion direction the spectrum information and phase information may be disentangled in the first dispersion direction. In the Y-direction, displacement and/or deformation of the first dispersed sample beams 751 is dependent on both the phase and the spectral components of the portion of measurement radiation 355 whereas displacement and/or deformation of the second dispersed sample beams 752 is dependent on the phase of the portion of measurement radiation 355. By comparing the displacement and/or deformation of the dispersed sample beams 751, 752 in the other dispersion direction the spectrum information and phase information may be disentangled in the other dispersion direction.

The wavefront sensing system 700 may further comprise a processor 450 configured to receive the measurement signal 341a, 341b and use the measurement signal to determine the phase of the portion of the measurement radiation 355. The processor 450 may comprise a plurality of processors in communication with each other and/or with a shared device.

Each dispersed sample beam 751, 752 may have an expected position (not shown) on the detector system 470a, 470b. The expected positions of the dispersed sample beams 751, 752 may be that the positions of the dispersed sample beams 751, 752 when the measurement radiation 325 has a substantially flat wavefront. An offset between the position of a dispersed sample beam 751, 752 and an expected position of the dispersed sample beam may be used to determine a phase of the portion of measurement radiation 355. For example, the offset between the position of a dispersed sample beam 751, 752 and an expected position of the dispersed sample beam 751, 752 may be used to determine a variation of the wavefront of the measurement radiation 325 from a substantially flat wavefront. Additionally or alternatively, a total or overall intensity of the individual dispersed sample beams 751, 752 may be used to determine variations of the intensity of the measurement radiation 325 within a pupil plane of the sensor apparatus 701.

In some embodiments, the wavefront sensing system may comprise a plurality of sampling optical elements. Each sampling optical element may be configured to sample a different portion of a wavefront of the portion of the measurement radiation to form a plurality of sample beams. The sampling optical elements may, for example, comprise micro-lenses. The sampling optical elements may be arranged in an array, e.g., a grid pattern. The wavefront sensing system may further comprise a detector system configured to detect each sample beam and output a signal indicative of at least one characteristic of the sample beams. The detector system may comprise a plurality of detectors, each of which may comprise a plurality of sensing elements, e.g., one or more CCD detectors. The sensing elements may be arranged in an array. The at least one characteristic of the sample beams may comprise information relating to a spatial intensity distribution of the sample beams. For example, the at least one characteristic of the sample beams may comprise a position of the sample beams (e.g., a position of a centre of the sample beams) in a plane that is generally perpendicular to an optical axis of the sensor apparatus. The position of a sample beam may be dependent on the phase of the portion of the measurement radiation from which the sample beam is formed. A displacement of the images of the sub-beams on the detector system from an expected position of the sub-beams may be used to determine a phase of the portion of the measurement radiation relative to a nominal phase (e.g., an ideal flat wavefront).

In the embodiments of sensor apparatus 300, 401, 501, 601, 701, at least some of the measurement radiation 360 is incident on a measurement system 350. The measurement system 350 is configured to receive the signal 340 and determine the position of the target 330 of the substrate W in at least partial dependence on the collected measurement radiation 325 and the determined pupil function variation of the portion of measurement radiation 355. One method for correcting for source errors using the phase of the measurement radiation (as contained in signal 340) is now discussed.

The determination of the position of the target 330 by the measurement system 350 may be similar to the determination of the position of target 205 by the measurement system 230 shown in FIG. 2 and discussed above. As explained above, at least a portion of one diffraction beam can be combined with at least a portion of a conjugate diffraction beam, the combined diffraction beams are received by a photodetector and an intensity of the combined diffraction beams is measured. An interferogram, or oscillating measured intensity, may be formed by generating relative movement between the substrate W and the sensor apparatus 200 whilst the radiation beam 215 is incident on the target 205. For a given relative phase between the two conjugate diffraction beams, the expected intensity of the radiation as determined by the photodetector can be determined, as now discussed.

In general, two rays of radiation from radiation beam 310 that are incident on the same point of the target 330 at different angles of incidence are not coherent. However, by scattering the radiation beam 310 and forming measurement radiation 325 comprising a plurality of diffraction orders, the target 310 may be considered to form a plurality of copies of the incident radiation cone (the copies having, in general different phases and intensities). Within any one of these copies, or diffraction beams, two rays of radiation which originate from the same point on the measurement target 330 but at different scattering angles, are not coherent (due to the properties of the radiation beam 310). However, for a given ray of radiation within any one of the diffraction beams there is a corresponding ray of radiation in each of the other diffraction beams that is spatially coherent with that given ray. For example, the chief rays of each of the diffraction beams (which correspond to the chief ray of the incident radiation beam 310) are coherent and could, if combined, interfere at the amplitude level. The conjugate diffraction beams may be combined such that these coherent beams interfere at the amplitude level. Therefore, for a given relative phase difference $\Delta\varphi$ between the two conjugate diffraction beams, the expected intensity of the radiation as determined by the photodetector can be determined by: (i) coherently summing each pair of coherent rays (which correspond to a given angle from the initial incident radiation beam 310) with the relative phase difference $\Delta\varphi$; and (ii) incoherently summing each of these coherent sums. It will be appreciated that the intensity for each ray will be dependent on both the intensity distribution of the incident radiation beam 310 and the scattering efficiencies of the grating formed by the target 310 (which are dependent on the grating geometry).

Any variation in the relative phase of the measurement radiation 325 in the pupil plane can give rise to an error in the expected amplitude of the radiation as determined by the photodetector and, in turn, a determined position of the target 330. However, if the wavefront sensor 335 is operable to determine a relative phase map of the measurement radiation 325 in pupil plane (at least in those parts of the pupil plane that the conjugate diffraction orders pass through), this could be used to determine a modified expected intensity of the radiation as determined by the photodetector (by modifying the relative phase with which conjugate rays are coherently summed in accordance with the value of the relative phase map of the measurement radiation 325 in position in the pupil plane through which they pass). In this way, for source errors can be corrected using the phase of the measurement radiation (as contained in signal 340).

Determining the pupil function variation of the portion of the measurement radiation allows for source errors to be corrected for. The determined pupil function variation of the portion of measurement radiation may be used to calculate and at least partially correct for a target position measurement error. The determined pupil function variation information may be used to understand and characterise optical aberrations and/or focus errors present in the sensor apparatus. Said optical aberrations and/or focus errors may be monitored using the wavefront sensor and any change over time may be determined and accounted for to improve an accuracy of target position measurements made using the sensor apparatus. The determined pupil function variation information may be used to determine a source of one or more optical aberrations and thereby enable modification or replacement of that optical component. Focus errors may, for example, comprise errors relating to a telecentricity of the sensor apparatus and/or an unwanted tilt of the substrate. Simultaneously measuring pupil function variation information of different spectral components of the portion of measurement radiation may improve a throughput of lithographic process that utilizes a sensor apparatus according to an embodiment of the invention. The sensor apparatus may be configured to measure a pupil function variation of the measurement radiation at any desired interval, e.g., once per lot of substrates, in order to determine a change of the error sources over time.

Unless stated otherwise, it will be appreciated that any reference herein to a phase of the measurement radiation in a pupil plane of the sensor apparatus is intended to mean a relative phase of the measurement radiation (for example relative to a reference phase) in a pupil plane of the sensor apparatus. Similarly, unless stated otherwise, it will be appreciated that any reference herein to an intensity of the measurement radiation in a pupil plane of the sensor apparatus is intended to mean a relative intensity of the measurement radiation (for example relative to a reference intensity) in a pupil plane of the sensor apparatus.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A sensor apparatus for determining a position of a target of a substrate comprising:
    projection optics configured to project a radiation beam onto the substrate;
    collection optics configured to collect measurement radiation formed by the radiation beam diffracted from the target;
    a wavefront sensing system configured to determine a pupil function variation of a first portion of the measurement radiation and output a signal indicative thereof; and
    a measurement system configured to receive the signal and a second portion of the measurement radiation from the collection optics and to determine the position of the target using both the second portion of the measurement radiation and the received signal.

2. The sensor apparatus of claim 1, wherein the wavefront sensing system comprises:
    a first dividing optical element configured to divide the at least first portion of the measurement radiation into a plurality of sub-beams;
    a detector system configured to detect an intensity of each sub-beam and output a measurement signal indicative thereof; and
    a processor configured to receive the measurement signal and to determine the pupil function variation of the at least first portion of the measurement radiation.

3. The sensor apparatus of claim 1, wherein the wavefront sensing system further comprises:

a dispersive optical element configured to separate the at least first portion of the measurement radiation in dispersed radiation beams with different wavelengths;

a plurality of dividing optical elements, wherein each of the plurality of dividing optical elements is configured to divide one of the dispersed radiation beams into a dispersed sub-beam; and a focus element configured to focus the at least first portion of the radiation of different wavelengths onto the plurality of dividing optical elements.

4. The sensor apparatus of claim 3, wherein the focusing element comprises an array of lenses.

5. The sensor apparatus of claim 1, wherein the wavefront sensing system comprises:

a plurality of sampling optical elements, wherein each sampling optical element is configured to sample a different portion of a wavefront of the at least first portion of the measurement radiation to form a plurality of sample beams;

a detector system configured to detect each sample beam and output a measurement signal indicative of at least one characteristic of the sample beams; and a processor configured to receive the measurement signal and use the measurement signal to determine the pupil function variation of the at least first portion of the measurement radiation.

6. The sensor apparatus of claim 5, wherein the wavefront sensing system further comprises:

a first dispersive optical element configured to separate the sample beams into dispersed sample beams with different wavelengths; and a first focusing element configured to focus the dispersed sample beams onto the detector.

7. The sensor apparatus of claim 6, wherein the wavefront sensing system further comprises:

a beam separator configured to direct a first portion of the sample beams to a first optical branch and direct a second portion of the sample beams to a second optical branch, wherein the first optical branch comprises:

the first dispersive optical element configured to separate different wavelengths of the first portion of sample beams in a first direction;

the first focusing element configured to focus the separated wavelengths of the first portion of sample beams into first dispersed sample beams, and wherein the second optical branch comprises:

a second dispersive optical element configured to separate different wavelengths of the second portion of sample beams in a different direction; and a second focusing element configured to focus the different wavelengths of the second portion of sample beams into second dispersed sample beams.

8. The sensor apparatus of claim 1, wherein the wavefront sensing system comprises at least one wavefront sensor.

9. A lithographic apparatus arranged to project a pattern from a patterning device onto a substrate, the lithographic apparatus comprising the sensor apparatus of claim 1.

10. A metrology device comprising the sensor apparatus of claim 1.

11. A method of determining a position of a target of a substrate comprising:

projecting a radiation beam onto the substrate;

collecting measurement radiation that has scattered from the target;

determining a pupil function variation of a first portion of the collected measurement radiation; and determining the position of the target using a second portion of the collected measurement radiation not used to determine the pupil function variation and the determined pupil function variation.

12. The method of claim 11, wherein the method is performed using a sensor apparatus to determine the position, the sensor apparatus comprising:

projection optics configured to project the radiation beam;

collection optics configured to collect the measurement radiation;

a wavefront sensing system configured to determine the pupil function variation; and a measurement system configured to receive the signal and to determine the position of the target.

13. The method of claim 11, wherein the measurement radiation comprises different wavelengths of radiation and wherein the method further comprises:

sampling different portions of a wavefront of the portion of the measurement radiation to form a plurality of sample beams;

splitting the sample beams into a first portion of sample beams and a second portion of sample beams;

separating the different wavelengths of the first portion of sample beams in a first dispersion direction to form first dispersed sample beams;

separating the different wavelengths of the second portion of sample beams in a different dispersion direction to form second dispersed sample beams;

comparing a displacement and/or a deformation of the first and second dispersed sample beams in the first dispersion direction;

comparing a displacement and/or a deformation of the first and second dispersed sample beams in the different dispersion direction; and using the comparisons to disentangle spectrum information and pupil function variation information in the first dispersion direction and the different dispersion direction.

14. The method of claim 13, further comprising:

determining a relative phase map of the measurement radiation in a pupil plane.

15. The method of claim 11, further comprising:

calculating a target position measurement error in dependence on the determined pupil function variation; and correcting the determined position of the target at least partially for the calculated target position measurement error.

* * * * *